United States Patent [19]

Baliga et al.

[11] 4,032,961

[45] June 28, 1977

[54] GATE MODULATED BIPOLAR TRANSISTOR

[75] Inventors: B. Jayant Baliga, Schenectady; Douglas E. Houston; Surinder Krishna, both of Ballston Lake, all of N.Y.

[73] Assignee: General Electric Company, Schenectady, N.Y.

[22] Filed: Aug. 23, 1976

[21] Appl. No.: 716,810

Related U.S. Application Data

[63] Continuation-in-part of Ser. No. 515,164, Oct. 16, 1974, Pat. No. 3,979,769.

[52] U.S. Cl. .................................. 357/57; 357/34; 357/36; 357/43; 357/88
[51] Int. Cl.² .................. H01L 29/66; H01L 29/72; H01L 27/92
[58] Field of Search ............... 357/34, 36, 43, 57, 357/88

[56] References Cited

UNITED STATES PATENTS

| 3,335,296 | 8/1967 | Smart ................................. 357/57 |
| 3,760,239 | 9/1973 | Fletcher et al. ..................... 357/34 |

Primary Examiner—Edward J. Wojciechowicz
Attorney, Agent, or Firm—Donald M. Winegar; Joseph T. Cohen; Jerome C. Squillaro

[57] ABSTRACT

Geometrical design criteria are disclosed for a Gate Modulated BiPolar Transistor, or GAMBIT, which is a three terminal variable negative resistance device. The GAMBIT is a planar, interdigited, integrated device whose electrical characteristics show a voltage controlled negative resistance between two of its terminals. The magnitude of the negative resistance is controlled by the variation of the applied bias to the third terminal.

12 Claims, 19 Drawing Figures

GATE MODULATED BIPOLAR TRANSISTOR

CROSS-REFERENCE TO RELATED PATENT APPLICATIONS

This application is a continuation-in-part of our copending application, Ser. No. 515,164, filed on Oct. 16, 1964 now U.S. Pat. No. 3,979,769 and assigned to the same assignee of the present invention.

BACKGROUND OF THE INVENTION

1. Field of the Invention

This invention relates to a method of controlling negative resistance in a circuit, and in particular, to a gate modulated bipolar transistor which functions as a three terminal negative resistance device.

2. Background of the Invention

Heretofore, most negative resistance devices have had only two terminals. These devices have been used in microwave oscillator circuits. However, such present devices have several disadvantages. One disadvantage is that the circuit must be designed around the particular value of the resistance of the two terminal device to be used in the circuit. A second disadvantage is that these present two terminal devices are limited to moderate power circuit applications since the magnitude of the resistances range from a few tends to a few hundreds of ohms. A third disadvantage of present day devices is that the magnitude of the negative resistance is susceptable to thermal instability and require complex circuitry for biasing the same.

An object of this invention is to provide a new and improved negative resistance which overcomes the deficiencies of prior art devices.

Another object of this invention is to provide a new and improved negative resistance device which includes means for controlling the magnitude of the negative resistance thereof.

A further object of this invention is to provide a three terminal negative resistance device wherein the magnitude of the negative resistance is controlled by the voltage impressed on a control electrode of the device.

A still further object of this invention is to provide geometrical design criteria for fabricating a three terminal negative resistance design for a particular circuit requirement.

Other objects of this invention will, in part, be obvious and will, in part, appear hereinafter.

BRIEF DESCRIPTION OF THE INVENTION

In accordance with the teachings of our invention, there is provided a novel gate modulated bipolar transistor (GAMBIT). The transistor includes an emitter region, at least one collector region, a base region and at least one gate region which is integral with the base region.

The gate modulated bipolar transistor comprises one region of first type conductivity and a first predetermined level of resistivity. The first region has two opposed major surfaces which are, respectively, the top and bottom surfaces thereof. The first region comprises the base and gate regions of the transistor.

The transistor also comprises a second region of a second, and opposite, type conductivity. The second region has two opposed major surfaces which are, respectively, the top and bottom surfaces thereof. The second region comprises the emitter region of the GAMBIT. The top surface of the second region is coextensive with the bottom surface of the first region. A first P-N junction is formed by the contiguous surfaces of the material of the abutting first and second regions of opposite type conductivity.

At least two spaced third regions of second type conductivity are disposed in a portion of the top surface of the first region. Each third region extends into the first region less than the thickness of the first region and has a surface coextensive with the top surface of the first region. Each third region forms a collector region of the transistor. A selected wall portion of each third region oriented opposed to a corresponding selected wall portion of the next adjacent collector of third region defines the gate region of the GAMBIT. A second P-N or collector junction is formed by the contiguous surfaces of the material of the abutting third and first regions of opposite type conductivity.

The design criteria for a preferred GAMBIT semiconductor device has a preferred distance between mutually adjacent collector regions. The preferred distance is less than 1.414 times the depletion layer width of the second P-N, or collector, junction at breakdown. That is, the width of each gate region is less than 1.414 times the depletion layer width of the collector junction at breakdown.

A fourth region of first type conductivity is disposed in a portion of the top surface of each of the gate regions. Each fourth region has a preferred level of resistivity which is less than that of the first region and a top surface coextensive with the top surfaces of the third, first and gate regions. The width of each fourth region is equal to less than 0.828 times the depletion layer width of the second P-N, or collector, junction at breakdown.

An ohmic electrical contact is affixed to each of the gate regions, via the fourth region, the collector regions and the emitter region.

When a variable voltage source, operating between predetermined limits is connected to the ohmic electrical contacts affixed to the gate regions, and a reverse bias is applied to the collector regions via the respective ohmic electrical contacts, an increase in the magnitude of the gate-collector reverse bias decrease the magnitude of the emitter and collector currents. The transistor or GAMBIT is thereby functioning as a negative resistance element, the magnitude of which is modulated by the variable voltage source.

DESCRIPTION OF THE INVENTION

Figure 1:
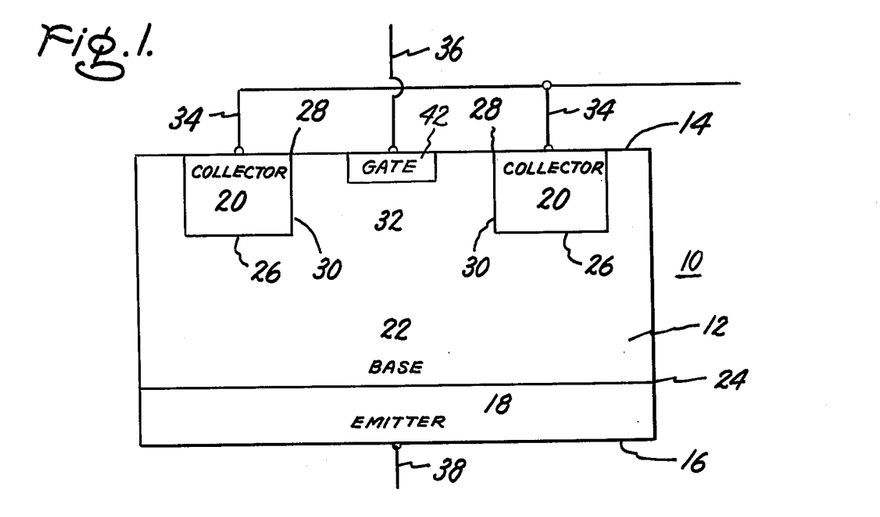
FIG. 1 is a side elevation view, in cross-section, of a gate modulated bipolar transistor made in accordance with the teachings of this invention.

With reference to FIG. 1, there is shown a GAte Modulated BIpolar Transistor (GAMBIT) 10 comprising a body 12 of single crystal semiconductor material having a predetermined level of resistivity and a first type conductivity. The body 10 has opposed major surfaces 14 and 16 which are the top and bottom surfaces respectively thereof. The semiconductor material comprising the body 12 may be silicon, germanium, silicon carbide, gallium arsenide, a semiconductor compound of a Group II element and a group VI element and a semiconductor compound of a Group III element and a group V element.

The body 10 is processed by suitable standard semiconductor process techniques, where feasible, such for example, as epitaxial growths of material, diffusion, ion implantation, temperature gradient zone melting, and the like. The resulting structure comprises an emitter region 18, at least one collector region 20 and a base region 22. The collector region 20 and the emitter region 18 are of the same type conductivity which is opposite to that type conductivity of the body 12 and the base region 19. P-N junctions 24 and 26 are formed by the contiguous surfaces of the material of the abutting regions 18 and 22, and 20 and 22, respectively, and of opposite type conductivity. the collector regions 20 is disposed in the base region 22 and has a surface which is coextensive with a major surface of the base region 22, the two surfaces comprising the top surface 14 of the device 10. P-N junction 26 has at least one end portion 28 which is exposed in the top surface 14. A selective side surface 30 of the one or more collector regions 20 defines a structure, or region 32, which is a portion of the base region 22 and which functions as a gate region. The gate region 32 has a top surface which is coextensive with the top surfaces of the collector regions 20 and the base region 22.

The dimensions of the body 12 and the regions 18, 20, 22 and 32 are determined by the magnitude of the negative resistance to be controlled by the device 10 in its operational mode and the material comprising the body 12. The thickness and resistivities of the regions 18 and 20 are determined by the desired operating characteristics of the completed device 10. The width of the gate region 32 is also determined by the desired operating characteristics of the completed device 10.

Ohmic electrical contacts 34, 36 and 38 are affixed to the collector regions 20, gate region 32 and emitter region 18, respectively, to provide suitable means for connecting the GAMBIT into an external electrical circuit.

Figure 2:
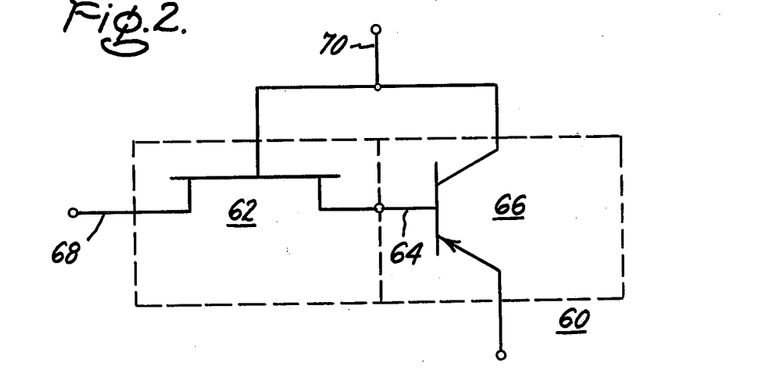
FIG. 2 is a schematic of an equivalent electrical circuit for the transistor of FIG. 1.

With reference to FIG. 2, there is shown an equivalent electrical circuit 60 for the GAMBIT device 10 of this invention. The circuit 60 is derived by combining the channel pinching off action of a junction field effect transistor (JFET) 62 into the base lead 64 of a bipolar transistor 66. The gate 68 bias of the JFET is derived from the collector 70 bias voltage. The electrical equivalent circuit 60 is useful in deriving the AC small signal performance of the device 10.

Figure 3:
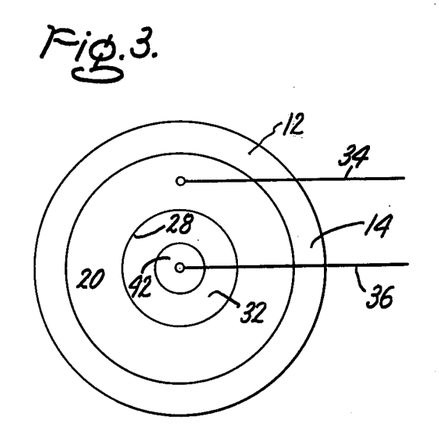
FIG. 3 is a top planar view of the transistor of FIG. 1.
Figure 4:
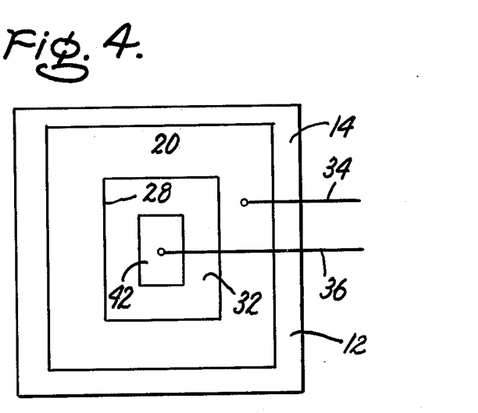
FIG. 4 is a top planar view of an alternate embodiment of the transistor of FIG. 1.

FIG. 3 and 4 are illustrative of different configurations of the regions 20 and 32 of the GAMBIT 10. In FIG. 3, the collector region 20 is annular and encompasses the gate region 32 of the transistor 10. The end portion 28 of the P-N junction 30 terminates in the top surface 14 and defines the gate region 32 which is cylindircal in shape and integral with the base region 22 of the body 12. The collector and gate regions, 20 and 32 respectively, have surfaces which are coextensive with each other and comprise the top surface 14 of the body 12. The regions 18, not shown, is the emitter region of the gate modulated bipolar transistor 10.

Referring now to FIg. 4, the configuration of the transitor 10 has a rectangularly shaped gate region 32 defined by windows in the collector region 20. The emitter region 18, not shown, is as before and has a surface which comprises the bottom surface 16 of the body 12 and the transistor 10.

The GAte Modulated BIpolar Transistor, or GAMBIT, may be of N-P-N or a P-N-P configuration. Ohmic electrical contacts 30, and 34 and 36 are affixed to the respective emitter region 18, collector region 20 and gate region 32 to enable the GAMBIT to be connected into electrical circuitry.

Figure 5:
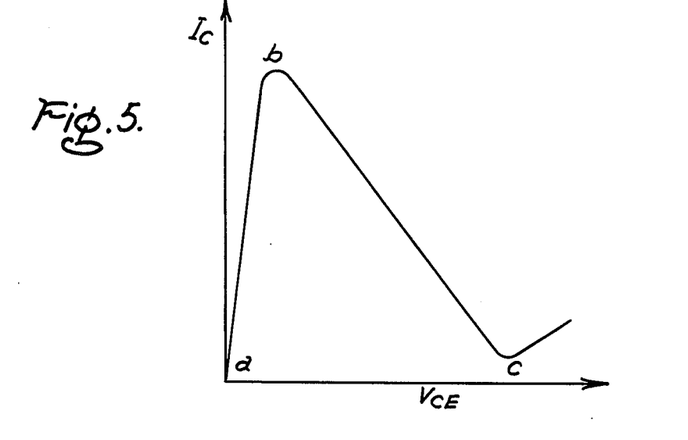
FIG. 5 is a graph of the $I_c$-$V_c$ characteristics of a transistor made in accordance with the teachings of this invention.
Figure 6:
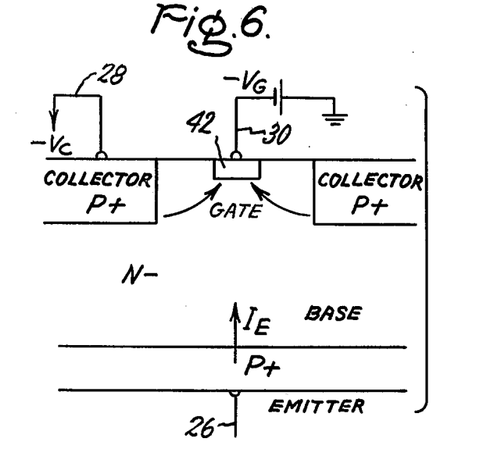
FIG. 6 is an illustration showing the current flow when the transistor of FIG. 1 is held in saturation.

Referring now to FIGS. 1, 2, 5, 6 and 7, the operation of a $P^+$-$N^-$-$P^+$ configuration GAMBIT will be described. When the gate modulated bipolar transistor 10 is energized, the charge injected from the P-type emitter region 18 is controlled by the electron charge in the gate region 22. The electron current is in turn modulated by the collector-to-gate reverse biasing. When the GAMBIT is in saturation, the current flow therein is as shown in FIG. 6. In this saturation condition, both the emitter and collector inject holes into the gate circuit such that $I_E + I_C = I_G$.

Figure 7:
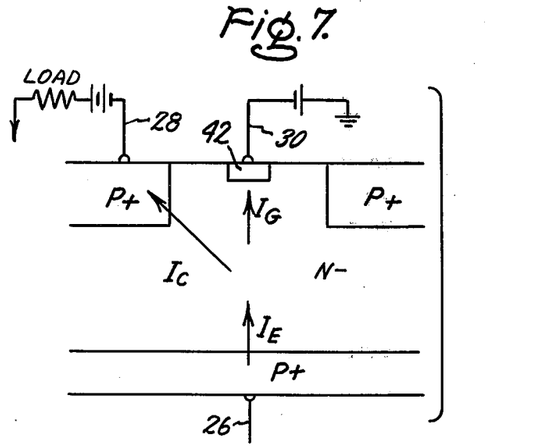
FIG. 7 is a schematic which illustrates the current flow of the transistor of FIG. 1 when the collector is reverse biased.

Upon the application of a reverse bias to the collector, as shown in FIG. 7, the GAMBIT is taken out of saturation. The emitter current $I_E$ is now shared between the collection region 20 and the gate region 32. As the grounded emitter gain $\beta$ of the GAMBIT is increased, the collector current $I_C$ increases to a maximum as shown by the portion of the curve ab of FIG. 5. As the collector current $I_C$ increases, the gate current $I_G$ is decreasing. The decrease in the gate current $I_G$ is the result of the increasing magnitude of the grounded emitter current gain $\beta$ of the GAMBIT.

As the magnitude of the gate-collector reverse bias continues to increase, the gate channel, region 32 defined by a selective portion 28 of the P-N junction 30 which terminates in the top surface 14, is pinched off by the increase in the depletion regions from the collector regions 20. The net result of this action on the gate channel is to decrease the electron current flow to the gate contact 36. This action dominates over the increase in $\beta$, the gain of the transistor, and the collector and emitter currents being to decrease. As the collector voltage, that is, the gate-collector reverse bias continues to *increase*, the emitter and collector currents continue to *decrease* as shown by the portion of the curve bc of FIG. 5. The magnitude of the negative resistance is determined by the gate voltage $V_G$.

Upon reaching the point of c of the curve of FIG. 5, the gate channel (base of the bipolar) is now pinched off. Any further increase in the gate-collector reverse bias will result in only a leakage current flow from the gate-collector junction region 30. The gate modulated bipolar transistor has been observed, to have a controllable negative resistance with values ranging from 100 ohms to 100K ohms.

Figure 8:
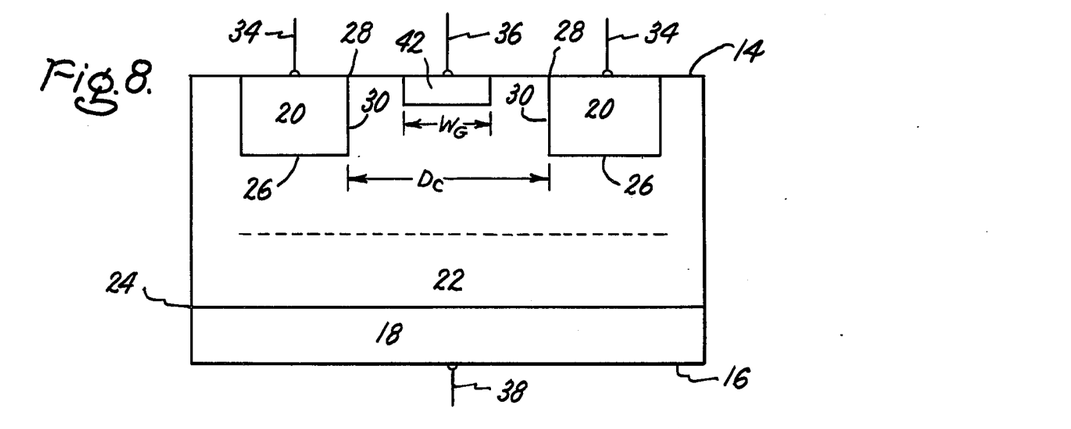
FIG. 8 is an elevation view, in cross-section, of the transistor of FIG. 1 illustrating design criteria for specific regions.

Referring now to FIG. 8, there is shown the device 10 illustrating several dimensional consideration for designing and fabricating GAMBIT devices. In order to provide a good ohmic electrical contact to the ate region 32 it is desirable to provide a highly doped gate contact region 42 of the same type conductivity as that of the gate region 32 and the base region 22. The width $W_G$ of the gate contact region 42 must be maintained at a dimension which is less than 0.828 times the depletion layer width $W_{DC}$ of the collector junction 30 at breakdown. The width, or distance, $D_C$, between mutually adjacent collector regions 20 must be maintained at less than 1.414 times the depletion layer width $W_{DC}$ of the collector junction 30 at breakdown. The relationship is also true when the collector 20 is annular and encircles the gate region 32. The design relationship relating maximum spacing between collector regions 30 to the width of the gate contact region 42 and the collector junction 30 depletion layer width $W_{DC}$ at breakdown is $$b = \frac{(d + W_{DC} \pm W_{DC} - d)^2 - 2d^2}{2}$$

where:
 $b$ = half spacing between collector regions, $D_c/2$,
 $d$ = half width of gate contact region, $W_G/2$, and
 $W_{DC}$ = depletion layer width of collector junction at breakdown In order to demonstrate the unique properties of the GAMBIT, a device 10 was designed, fabricated and tested to evaluate the actual electrical characteristics determined upon testing against the theoretical results determined beforehand.

The device consisted of 270 spaced collector regions 30, each 0.3 cm in length, $10^{-3}$ cm in depth and $3 \times 10^{-3}$ cm in width at the surface. The collector regions were formed by diffusing Boron into N-type conductivity silicon of 50–70 ohm-centimeter resistivity. The inner edges of the regions 30 were spaced $2.5 \times 10^{-3}$ cm apart from each other at the surface.

The emitter region 18 was formed by diffusion of boron through the surface 16 to form a region $5 \times 10^{-3}$ cm in depth. The width of the base region 22, the distance from junction 24 to the portion 26 of junction 30 was $2. \times 10^{-2}$ cm.

The gate contact region 42 between each pair of collector region 30 was formed by diffusion of phosphorus through the surface 14. Each region 42 was $1.2 \times 10^{-3}$ in width and $1.0 \times 10^{-4}$ in depth.

Figure 9:
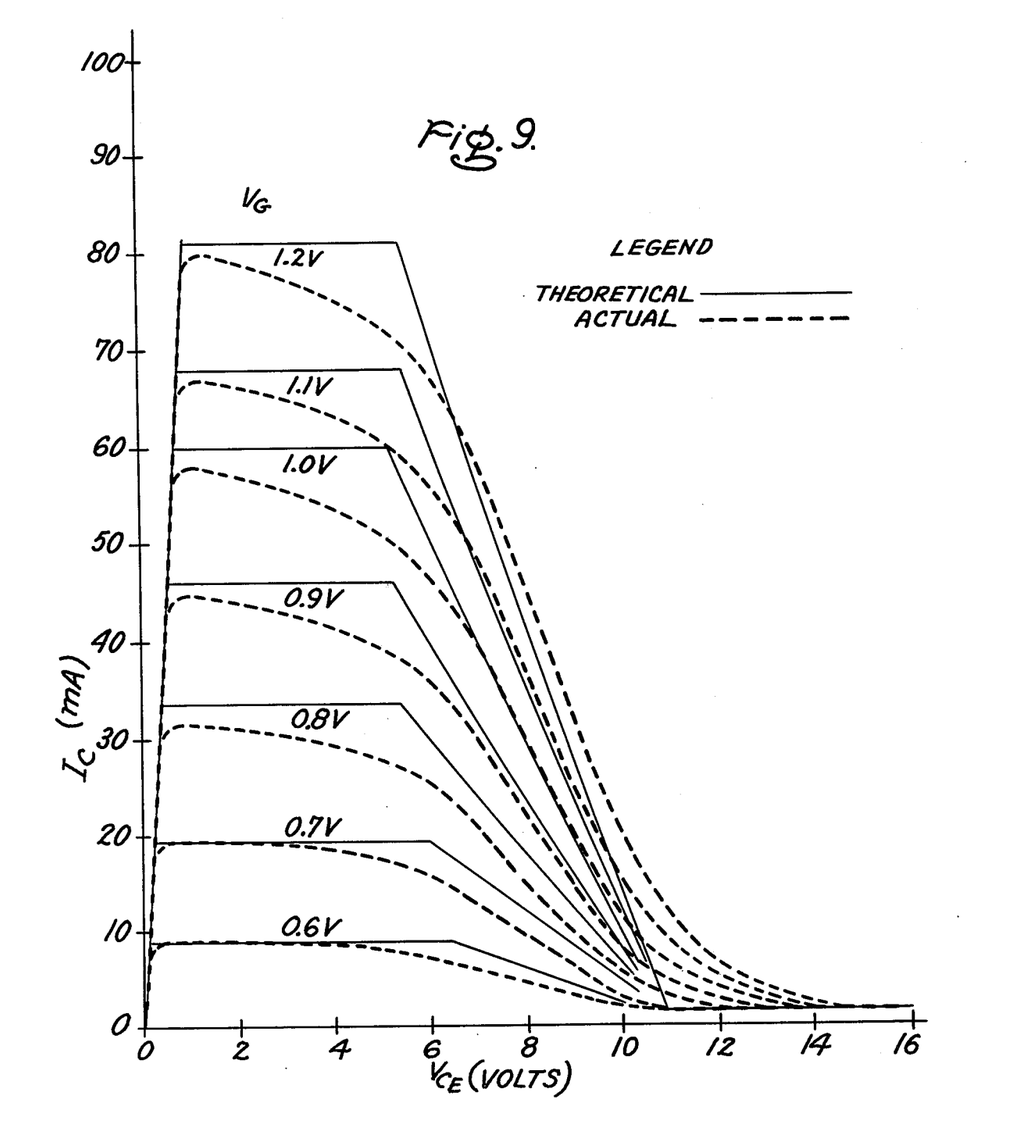
FIG. 9 is a graph of data obtained from a device compared with theoretical data calculated for the same device.

The fabricated device 10 was electrically tested at various voltages applied to the gate via electrical lead 36. the results were compared with the theoretical values derived by calculation. A graph of the data of actual and theoretical collector current in milliamperes, $I_C$, (mA), versus collector to emitter voltage, $V_{CE}$ (volts) is shown in FIG. 9 for various applied voltages, $V_G$.

Figure 10:
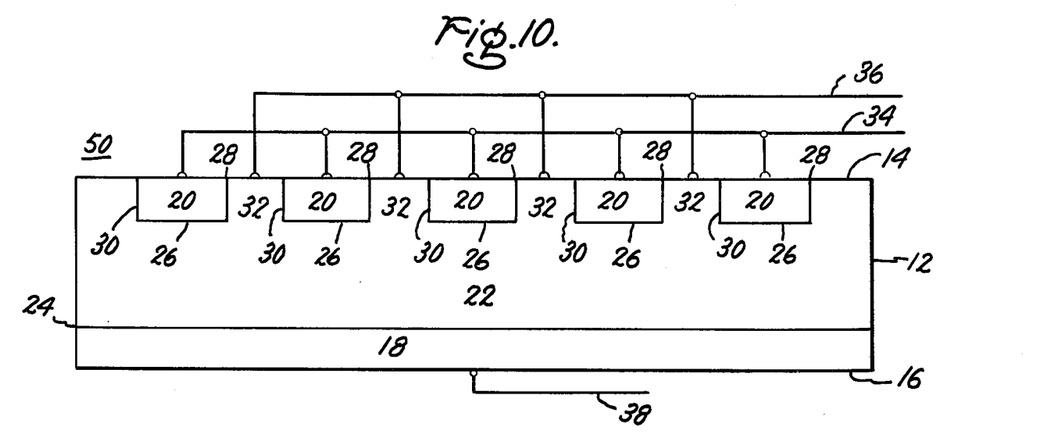
FIG. 10 is an elevation view, in cross-section, of an alternate embodiment of the transistor of FIG. 1.
Figure 11:
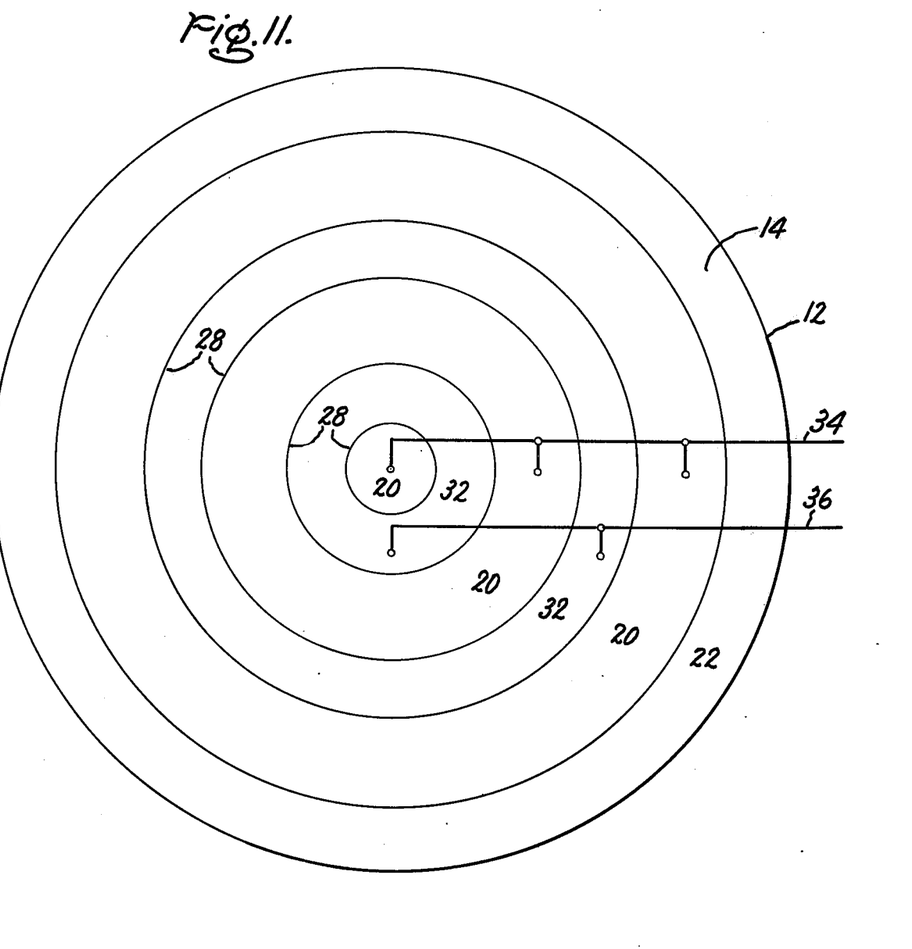
FIG. 11 is a top planar view of the transistor of FIG. 10.
Figure 12:
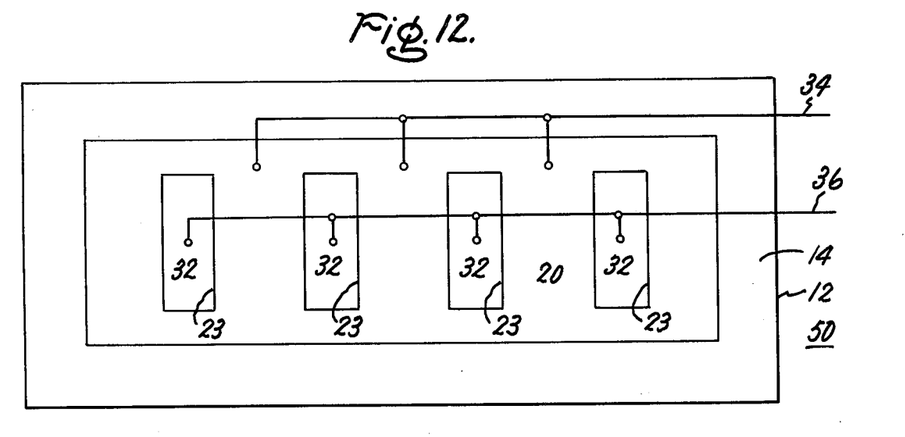
FIG. 12 is a top planar view of an alternate embodiment of the transistor of FIG. 10.

Referring now to FIG. 10, there is shown a GAte Modulated BIpolar Transistor 50 which is an alternate embodiment of the gate modulated bipolar transistor 10 of FIG. 1. The only difference is that the transistor 50 embodies a plurality of gate regions 32. All reference numbers which are the same as in FIG. 1, denote the same items which function in the same manner as described before. With reference to FIG. 11 and 12, the regions 20 and 32 may be annular in configuration, or of a rectangular configuration, respectively.

Figure 13:
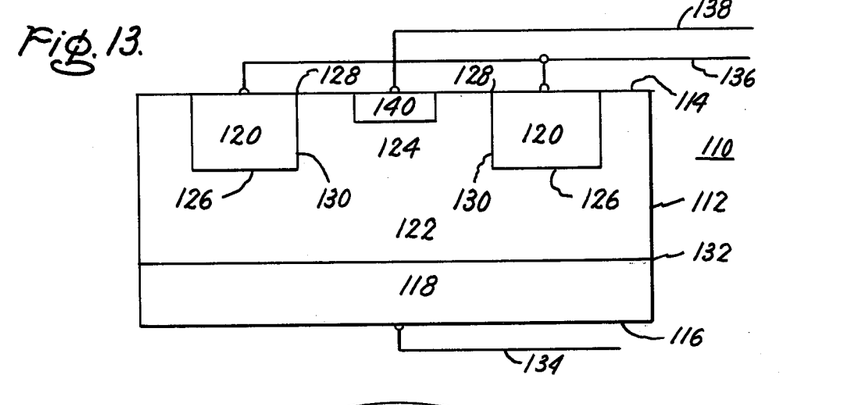
FIG. 13 is a side elevation view, in cross-section, of another embodiment of a gate modulated bipolar transistor of FIG. 1 and made in accordance with the teachings of this invention.

With reference to FIG. 13, there is shown a gate modulated bipolar transistor 110. The transistor 110 comprises a body 112 of single crystal semiconductor material having two major opposed surfaces 114 and 116 which are, respectively, the top and bottom surfaces of the transistor 110, an emitter region 118, a collector region 120, a base region 122 and a gate region 124. A P-N junction 126 is formed by the abutting surfaces of the regions 120 and 122 of opposite type conductivity. An end portion 128 of each P-N junction 126 terminates in, and is exposed, in the top surface 114. A selected portion 130 of each pair of mutually adjacent P-N junctions 124 of the respective mutually adjacent collector regions 120 defines the gate region 124 which is integral with the base region 122 which comprises the original material of the body 112. The material comprising the body 112 is the same as that comprising the body 12 of transistor 10.

The transistor 110 differs from transistor 10 of FIG. 1 in that the material comprising the body 112, and therefore the gate and base regions 124 and 122 respectively, and the material of the emitter region 118 are of different semiconductor materials. The semiconductor material of the body 112 and region 118 are selected so as to form a heterojunction 132 by the abutting surfaces of the regions of different material. For example, the body 112 may be of N-type silicon semiconductor material and the emitter region 118 may be of gallium arsenide material which is of P+-type conductivity.

The emitter 118 may be formed by any suitable means known to those skilled in the art such, for example, as by vapor deposition of the suitable material on a prepared surface of the material comprising the body 112. Preferably, the emitter region 118 is grown on the material of the body 112 before the collector region, or regions, 120 are formed in the body 112 to define gate region 124. The collector 120 is formed by either diffusion, ion implantation, temperature gradient zone melting, and the like, or by other suitable semiconductor processing techniques well known to those skilled in the art.

An electrical lead 134 is affixed by an ohmic electrical contact to the emitter region 118. Electrical lead 136 is affixed y an ohmic electrical contact to the collector region 120. An electrical lead 138 is affixed by an ohmic electrical contact to the gate region 124. Preferably, a gate contact region 140 is formed in the gate region 124 and the lead 124 attached thereto. The region 140 is highly doped and of the same conductivity type as the region 122 and 124.

The gate modulated bipolar transistor 110 functions in exactly the same manner as the transistor 10 and 50.

Figure 14:
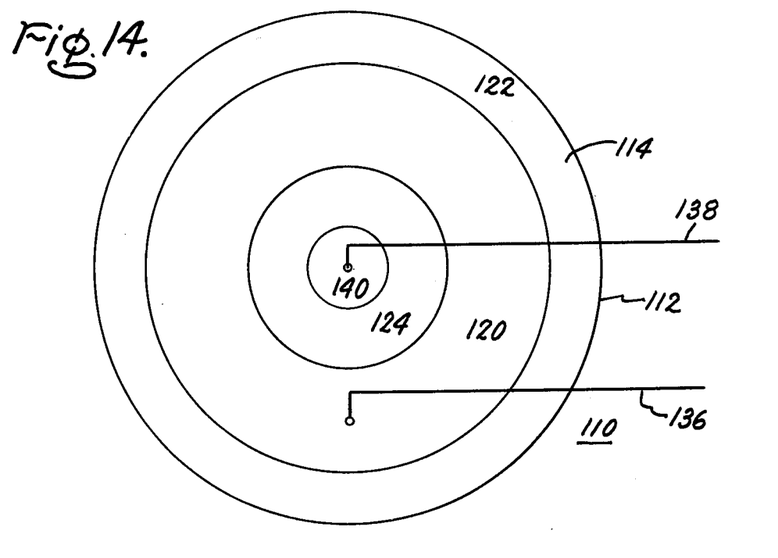
FIG. 14 is a top planar view of the transistor of FIG. 13.
Figure 15:
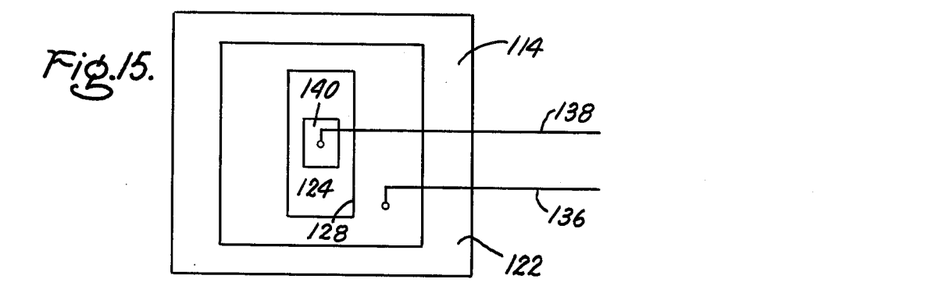
FIG. 15 is a top planar view of an alternate embodiment of the transistor of FIG. 13.

Referring now to FIG. 14, the transistor 110 may have concentric annular collector and gate region 120 and 122, respectively. Alternately, the transistor 110 may have a rectangular configuration for the collector region 120 with the gate region 124 therebetween as shown in FIG. 15.

Figure 16:
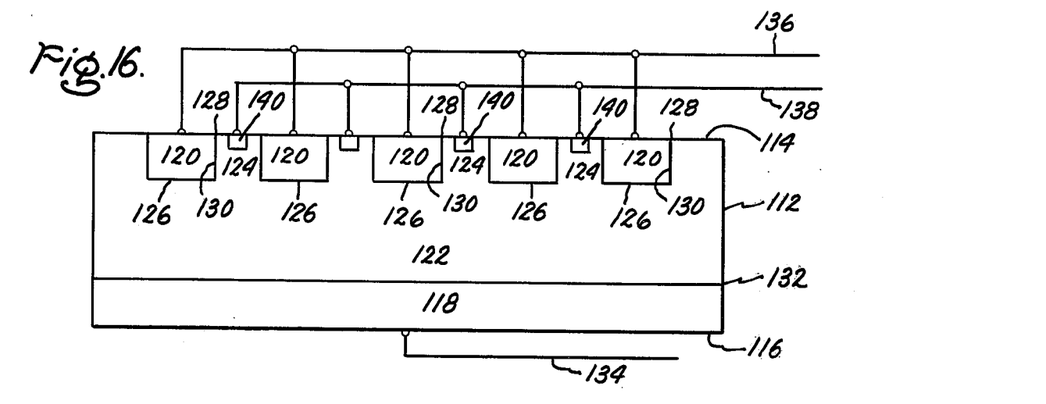
FIG. 16 is a side view, in cross-section, of a further embodiment of a gate modulated bipolar transistor of FIG. 1 and made in accordance with the teachings of this invention.

With reference to FIG. 16, there is shown a gate modulated bipolar transistor 150 which is an alternate embodiment of the transistor 110. All reference numerals which are the same as in FIG. 13, denote items which are the same, and function in the same manner, as the same items of FIG. 13. The difference in the two transistors is that transistor 150 embodies a plurality of gate regions 124 defined by windows in collector region 120. The transistor 150 functions in exactly the same manner as the transistors 10, 50 and 110.

Figure 17:
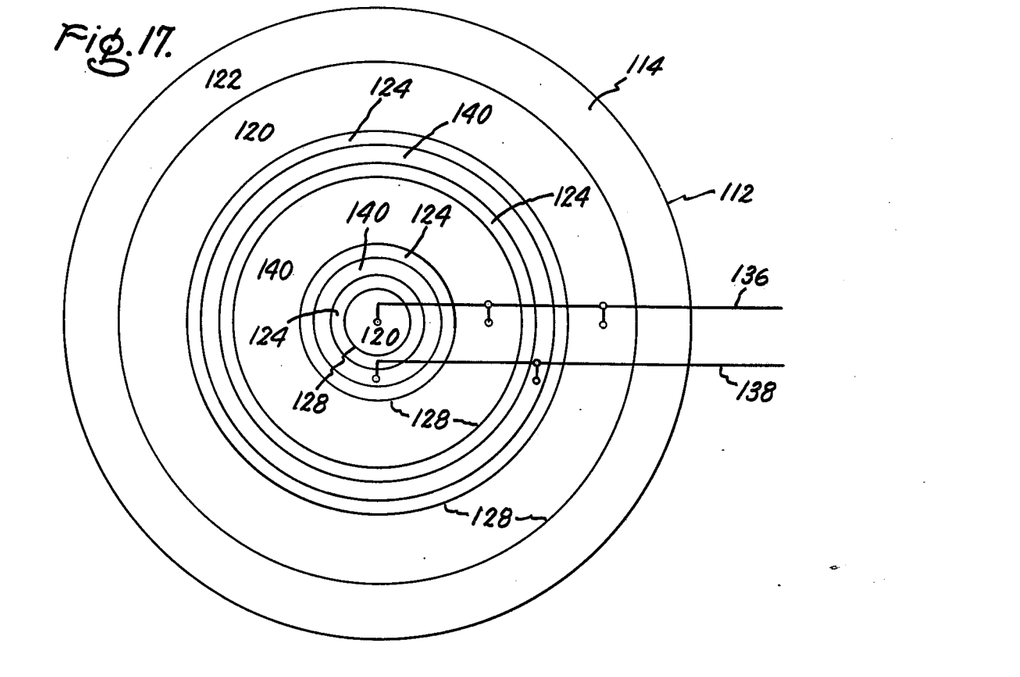
FIG. 17 is a top planar view of the transistor of FIG. 16.
Figure 18:
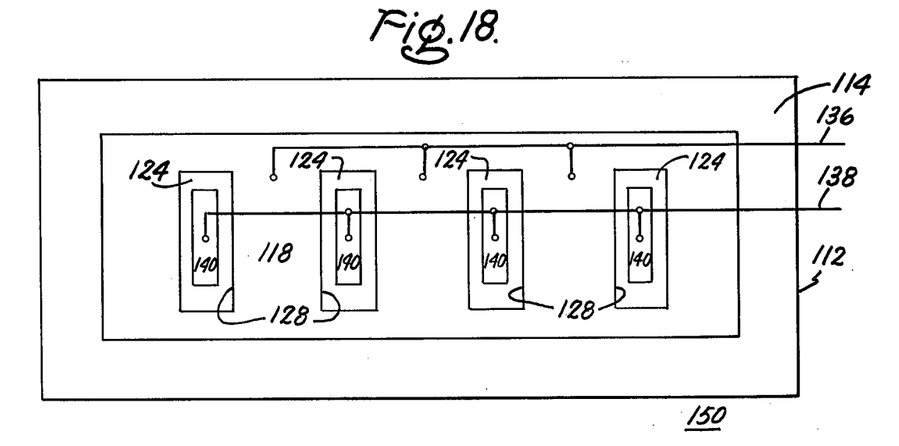
FIG. 18 is a top planar view of an alternate embodiment of the transistor of FIG. 16.

The collector and gate regions 120, and 124, respectively, of the transistor 150 may be of a concentric annular region configuration as shown in FIG. 17. Alternately, with reference to FIG. 18, the configuration of the collector region 120 may be rectangular and the gate regions 124 are formed in between each pair of selected adjacent portions of the regions 120 and defined by a selective portion 130 of the P-N junction 126 terminating in the surface 114.

Preferably, the gate-modulated bipolar transistor is fabricated in a manner wherein the collector region and gate region utilizes the maximum volume of the body of semiconductor material. In such cases where the collector region is fabricated as close to the outer peripheral surface of the body as possible, means must be provided to protect the electrical integrity of the P-N junctions formed therein.

Figure 19:
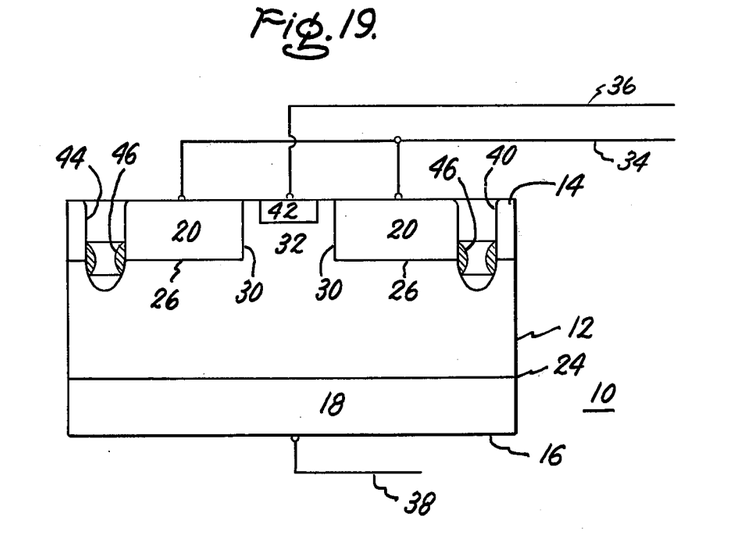
FIG. 19 is a side elevation view, in cross-section, of a modification of the transistor of FIG. 1 made in accordance with the teachings of this invention.

For example, with reference to FIG. 19, the device 10 of FIG. 1 is modified wherein the collector region 20 is disposed in the surface 14 of the body 12 encompassing the ohmic contact affixed to lead 36. Employing selective chemical etching a moat defined by walls 44 is formed in the outer peripheral surface portion of the top surface 10 and extends downward a sufficient distance to expose the P-N junction 26 therein. A layer 46 of an electrical insulating material such, for example, as silicon oxide, silicon nitride, rubber-like coatings and the like are disposed on the exposed portions of the P-N junction 26 to protect the electrical integrity thereof.

The gate modulated bipolar transistor of this invention is suitable for applications as a circuit element from DC to the microwave region.

We claim as our invention:

1. A gate modulated bipolar transistor including
an emitter region, at least one collector region, a base region and at least one gate region integral with the base region;
a first region having opposed major surfaces, which are, respectively, the top and bottom surfaces thereof, and a first type conductivity, the first region comprising the base and gate regions;
a second region having opposed major surfaces, which are, respectively, the top and bottom surfaces thereof, and a second and opposite type conductivity, the second region comprising the emitter region;
the top surface of the second region being coextensive with the bottom surface of the first region;
a first P-N junction formed by the contiguous surfaces of the material of the first and second regions of opposite type conductivity;
at least two spaced third regions of second type conductivity disposed in a portion of the top surface of the first region and extending into the first region a distance less than the thickness of the first region, each third region functioning as a collector region and having a top surface coextensive with the top surface of the first region a selected wall surface opposed to a selective wall surface of a mutually adjacent third region thereby defining a gate region therebetween;
a second P-N junction formed by the contiguous surfaces of the material of abutting first and third regions of opposite type conductivity;
the distance between the opposed selective wall surfaces of the spaced collector regions being less than 1.414 times the depletion layer width of the second P-N junction at breakdown of the device;
a fourth region of first type conductivity disposed in a portion of the top surface of each of the gate regions, each fourth region having a top surface coextensive with the top surface of the third regions and the gate regions and a level of resistivity which is less than that of the gate region;
the width of each fourth region is equal to less than 0.828 times the depletion layer width of the second P-N junction at breakdown;
a plurality of first ohmic electrical contacts, each contact is affixed to one of the fourth regions;
a second ohmic electrical contact affixed to the bottom surface of the second region;
a plurality of third electrical contacts, each contact being affixed to one of the third regions, and wherein
when a variable voltage source, operating between predetermined limits, is connected to the first ohmic electrical contact to drive the gate region and reverse bias is applied to the collector region via the third ohmic electrical contacts, an increase in the gate-collector reverse bias decreases the emitter and collector currents and the transistor functions as a negative resistance element, the magnitude of which is modulated by the variable voltage source.

2. The transistor of claim 1 wherein
the third regions are integral with each other to form one region which has an annular configuration which encompasses the gate region.

3. The transistor of claim 1 wherein
a plurality of third regions are disposed in the portion of the top surface to define a plurality of gate regions, and
a plurality of first contacts, each contact is disposed upon a respective gate region defined by a pair of third regions.

4. The transistor of claim 3 wherein
each third region has a rectangular configuration and each gate region has a rectangular configuration.

5. The transistor of claim 2 and including a plurality of spaced concentric annular third regions disposed in the top surface portion of the first region defining a plurality of spaced annular gate regions;

a plurality of first ohmic electrical contacts, each first contacts being affixed to a respective one of the gate regions, and a plurality of third ohmic electrical contacts, each third electrical contact being affixed to a respective one of the plurality of third regions.

6. The transistor of claim 1 including walls defining an annular moat in the outer peripheral portion of the transistor and extending downward from the top surface of the first region to at least intersect, and expose therein, the first P-N junction, and a layer of electrically insulating material disposed on the exposed portions of the first P-N junction in the trough.

7. An electrical circuit including two electrical terminals;

a power source;

a first electrical circuit means connected between the two electrical terminals and connecting the power source to the electrical load;

a gate modulated bipolar transistor including an emitter region, at least one collector region, a base region and at least one gate region integral with the base region;

a first region having opposed major surfaces, which are, respectively, the top and bottom surfaces thereof, and a first type conductivity, the first region comprsing the base and gate regions;

a second region having opposed major surfaces, which are, respectively, the top and bottom surfaces thereof, and a second and opposite type conductivity, the second region comprising the emitter region;

the top surface of the second region being coextensive with the bottom surface of the first region;

a first P-N junction formed by the contiguous surfaces of the material of the first and second regions of opposite type conductivity;

at least two spaced third regions of second type conductivity disposed in a portion of the top surface of the first region and extending into the first region, a distance less than the thickness of the first region, each third region functioning as a collector region and having a top surface coextensive with the top surface of the first region a selected wall surface opposed to a selective wall surface of a mutually adjacent third region thereby defining a gate region therebetween;

a second P-N junction formed by the contiguous surfaces of the material of abutting first and third regions of opposite type conductivity;

the distance between the opposed selective wall surfaces of the spaced collector regions being less than 1.414 times the depletion layer width of the second P-N junction at breakdown of the device;

a fourth region of first type conductivity disposed in a portion of the top surface of each of the gate regions, each fourth region having a top surface coextensive with the top surface of the third regions and the gate regions and a level of resistivity which is less than that of the gate region;

the width of each fourth region is equal to less than 0.838 times the depletion layer width of the second P-N junction at breakdown;

a plurality of first ohmic electrical contacts, each contact is affixed to one of the fourth regions;

a second ohmic electrical contact affixed to the bottom surface of the second region;

a plurality of third electrical contacts, each contact being affixed to one of the third regions, and wherein when a variable voltage source, operating between predetermined limits, is connected to the first ohmic electrical contact to drive the gate region and reverse bias is applied to the collector region via the third ohmic electrical contacts, an increase in the gate-collector reverse bias decreases the emitter and collector currents and the transistor functions as a negative resistance element, the magnitude of of which is modulated by the variable voltage source;

a second electrical circuit means connecting the collector region to one of the electrical terminals;

a third electrical circuit means connecting the emitter region to the other of the electrical terminals, and a variable voltage source, operating between predetermined limits, connected to drive the at least one gate region, wherein when a reverse bias is applied to the collector an increase in the gate-collector reverse bias decreases the emitter and collector currents and transistor functions as a negative resistance element, the magnitude of which is modulated by the variable voltage source.

8. The electrical circuit of claim 7 wherein the third regions are integral with each other to form one region which has an annular configuration which encompasses the gate region.

9. The electrical circuit of claim 7 wherein a plurality of third regions are disposed in the portion of the top surface to define a plurality of gate regions, and a plurality of first contacts, each contact is disposed upon a respective gate region defined by a pair of third regions.

10. The electrical circuit of claim 9 wherein each third region has a rectangular configuration and each gate region has a rectangular configuration.

11. The electrical circuit of claim 8 and including a plurality of spaced concentric annular third regious disposed in the top surface portion of the first region defining a plurality of spaced annular gate regions;

a plurality of first ohmic electrical contacts, each first contact being affixed to a respective one of the gate regions, and a plurality of third ohmic electrical contacts, each third electrical contact being affixed to a respective one of the plurality of third regions.

12. The transistor of claim 7 including walls defining an annular moat in the outer peripheral portion of the transistor and extending downward from the top surface of the first region to at least intersect, and expose therein, the first P-N junction, and a layer of electrically insulating material disposed on the exposed portion of the first P-N junction in the trough.

* * * * *